US012713853B2

(12) United States Patent
Zhu et al.

(10) Patent No.: US 12,713,853 B2
(45) Date of Patent: Aug. 18, 2026

(54) OXIDE QUALITY DIFFERENTIATION

(71) Applicant: Applied Materials, Inc., Santa Clara, CA (US)

(72) Inventors: Lala Zhu, Fremont, CA (US); Yimin Huang, Santa Clara, CA (US); Shi Che, Sunnyvale, CA (US); Yi Jin, San Mateo, CA (US); Dongqing Yang, Pleasanton, CA (US); Lakmal C. Kalutarage, San Jose, CA (US); Anchuan Wang, San Jose, CA (US); Nitin K. Ingle, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 364 days.

(21) Appl. No.: 18/485,998

(22) Filed: Oct. 12, 2023

(65) Prior Publication Data

US 2025/0125154 A1 Apr. 17, 2025

(51) Int. Cl.
*H10P 50/28* (2026.01)
*H10P 70/00* (2026.01)

(52) U.S. Cl.
CPC ............ *H10P 50/283* (2026.01); *H10P 70/15* (2026.01)

(58) Field of Classification Search
CPC ......... H01L 21/31111; H01L 21/02052; H01L 21/3105; H01L 21/31116
USPC .................................................. 438/689–714
See application file for complete search history.

(56) References Cited

U.S. PATENT DOCUMENTS 6,100,163 A * 8/2000 Jang .................. H01L 21/76224 257/E21.546
2005/0017365 A1 1/2005 Ramachandrarao et al.
2005/0260859 A1 11/2005 Deshpande et al.
2008/0146034 A1 6/2008 Shen et al.
2008/0305609 A1* 12/2008 Shih .................. H01L 21/02304 257/E21.546

(Continued)

FOREIGN PATENT DOCUMENTS

KR 102463918 B1 11/2022
TW 202115787 A 4/2021

OTHER PUBLICATIONS

Application No. PCT/US2023/082268 , International Search Report and Written Opinion, Mailed on Jul. 1, 2024, 12 pages.

(Continued)

*Primary Examiner* — Duy Vu N Deo
(74) *Attorney, Agent, or Firm* — Kilpatrick Townsend & Stockton LLP

(57) ABSTRACT

Exemplary methods and systems of semiconductor processing may include etching a portion of a silicon-containing material from a substrate disposed within a processing region of a semiconductor processing chamber. Methods may include forming a low quality oxide within one or more of the recesses, where the low quality oxide and a silicon-containing material each contain an exposed surface. Methods include contacting the low quality oxide and the high quality semiconductor material with a passivating agent selective to a surface defect of the low quality oxide. Methods include contacting the substrate with an etching agent and/or a cleaning agent, where the contacting with the cleaning agent removes the high quality semiconductor material at an equal or faster rate than the low quality oxide.

20 Claims, 5 Drawing Sheets

(56) References Cited

U.S. PATENT DOCUMENTS

| | | | | |
|---|---|---|---|---|
| 2012/0129346 | A1* | 5/2012 | Ryuzaki | H01L 21/31053 438/693 |
| 2013/0256267 | A1* | 10/2013 | Ota | B05C 9/14 156/345.24 |
| 2014/0239393 | A1 | 8/2014 | Kuo et al. | |
| 2019/0123179 | A1 | 4/2019 | Wann et al. | |
| 2019/0245040 | A1 | 8/2019 | Chiang et al. | |
| 2020/0066539 | A1 | 2/2020 | Pearlstein | |
| 2021/0159123 | A1 | 5/2021 | Hung et al. | |
| 2022/0045214 | A1 | 2/2022 | Chen et al. | |

OTHER PUBLICATIONS

Application No. TW113100888 , Office Action, Mailed on Aug. 14, 2024, 10 pages.

Taiwanese Application No. 113100888, Notice of Decision to Grant mailed on Jul. 28, 2025, 4 pages (2 pages of English Translation and 2 pages of Original Document).

* cited by examiner

OXIDE QUALITY DIFFERENTIATION

TECHNICAL FIELD

The present technology relates to methods and systems for semiconductor processing. More specifically, the present technology relates to systems and methods for retaining desired oxide layers during one or more cleaning operations.

BACKGROUND

Integrated circuits are made possible by processes which produce intricately patterned material layers on substrate surfaces. Producing patterned material on a substrate requires controlled methods for forming and removing material. As device sizes continue to reduce, film characteristics may lead to larger impacts on device performance. Materials used to form layers of materials may affect operational characteristics of the devices produced. As material thicknesses continue to reduce, as-deposited characteristics of the films may have a greater impact on device performance.

Thus, there is a need for improved systems and methods that can be used to produce high quality devices and structures. These and other needs are addressed by the present technology.

SUMMARY

The present technology is generally directed to semiconductor processing methods. Methods include etching a portion of a silicon-containing material from a substrate disposed within a processing region of a semiconductor processing chamber, forming one or more recesses. Methods include forming a low quality oxide within one or more of the recesses, wherein the low quality oxide and a silicon-containing material each comprise an exposed surface. Methods include contacting the low quality oxide and the silicon-containing material with a passivating agent selective to the low quality oxide. Methods include contacting the substrate with an etching agent and/or a cleaning agent, wherein the contacting with the cleaning agent removes the silicon-containing material at an equal or faster rate than the low quality oxide.

In embodiments, methods include where the passivating agent includes an organosilane. In more embodiments the organosilane includes a vinyl silane. Moreover, in embodiments, the vinyl silane includes vinyl silane, trimethylvinylsilane (TMVS), vinyltrichlorosilane, vinyltrimethoxysilane, vinyltriethoxysilane, vinyltris(2-methoxyethoxy)silane, vinyltrisisopropoxysilane, vinyltris(tert-butylperoxy)silane, vinyldimethylchlorosilane, vinyldimethylethoxysilane, vinylmethyldichlorosilane, vinylmethyldimethoxysilane, vinylmethyldiethoxysilane, methylvinyldi(n-methylacetylamido)silane, methylvinyldi(5-caprolactam)silane, bis(methyldichlorosilyl)ethane, and combinations thereof. Additionally or alternatively, in embodiments, contacting the low quality oxide with the passivating agent includes a silylation process. Embodiments include where the low quality oxide has a surface hydroxyl content of greater than or about 4 $\mu mol/m^2$. In embodiments, the low quality oxide comprise a chemical oxide of silicon. Furthermore, in embodiments, the silicon-containing material has a surface hydroxyl content of less than or about 2 $\mu mol/m^2$. In embodiments, the silicon-containing material includes polysilicon, silicon germanium, thermal silicon oxide or dioxide, native oxide, or a combination thereof. In more embodiments, less than or about 20% of the passivated low quality oxide is removed after contacting with the etching agent and/or cleaning agent.

The present technology is also generally directed to methods of forming a semiconductor structure. Methods include etching one or more recesses in a substrate disposed within a processing region of a semiconductor processing chamber, where a silicon-containing material extends into one or more recesses defined by alternating layers of material deposited on the substrate. Methods include where an exposed surface of the silicon-containing material is characterized by a first hydroxyl concentration. Methods include forming an oxide material in the one or more recesses, the oxide material having an exposed surface characterized by a second hydroxyl concentration, where the second hydroxyl concentration is greater than the first hydroxyl concentration. Methods include exposing the processing region to a passivating agent, where the passivating agent undergoes a silylation process with one or more hydroxyl groups. Methods include contacting the substrate with an etching agent and/or a cleaning agent.

In embodiments, methods include providing one or more etchant precursors to the processing region of the semiconductor processing chamber, contacting the substrate with the one or more etchant precursors and etching a portion of the silicon-containing material from the substrate. In more embodiments, the second hydroxyl concentration is greater than or about 50% higher than the first hydroxyl concentration. Furthermore, in embodiments, the second hydroxyl concentration is greater than or about 100% higher than the first hydroxyl concentration. In yet more embodiments, the semiconductor structure comprises a gate all around structure. Embodiments include exposing the substrate to ultraviolet (UV) radiation.

The present technology is also generally directed to semiconductor processing methods. Methods include contacting a semiconductor structure with a passivating agent, where the semiconductor structure includes a substrate, a silicon-containing material having an exposed surface characterized by a first hydroxyl concentration, and an oxide material having an exposed surface characterized by a second hydroxyl concentration. Methods include where the second hydroxyl concentration is greater than the first hydroxyl concentration, and where the passivating agent undergoes a silylation process with one or more hydroxyl groups. Methods include contacting the substrate with an etching agent and/or a cleaning agent, removing a portion of the silicon-containing material.

In embodiments, less than or about 20% of the oxide material is removed after contacting with the etching agent and/or cleaning agent. In more embodiments, passivating occurs in a first chamber, and the semiconductor structure is transferred to a second processing chamber prior to contacting the semiconductor structure with the etching agent and/or cleaning agent. Furthermore, in embodiments, contacting the substrate with the etching agent and/or cleaning agent comprises a reactive ion etch, a selective oxide preclean, or a combination thereof.

Such technology may provide numerous benefits over conventional systems and techniques. For example, embodiments of the present technology may reduce the etch rate of low quality, high hydroxyl content, oxides while retaining the etch rate of a target material. Additionally, the present technology may selectively passivate a low quality oxide. The selective passivation may limit the etch of the low quality oxide, reducing the risk of merging during epitaxial growth. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
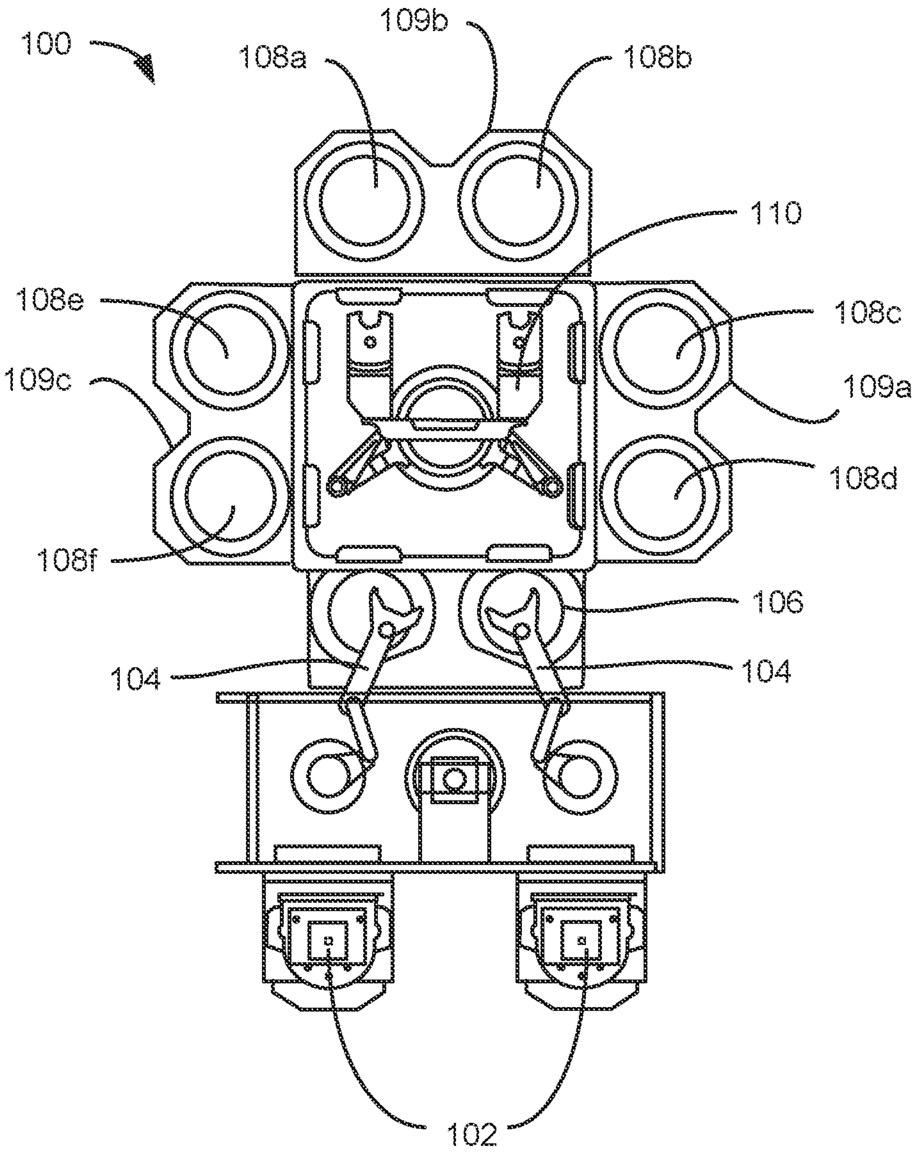
FIG. 1 shows a top plan view of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As semiconductor device sizes continue to reduce, the constituent films included within a structure may affect device performance, as well as fabrication of other materials being included in the device. Additionally, as demand increases, throughput and queue times become a point of emphasis. Thus, a demand exists for high-quality materials and structures that may be formed both quickly and efficiently. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective to the first material. As a result of the diversity of materials, circuits and processes, etch processes have been developed with a selectivity towards a variety of materials.

Existing conformal etch exhibits a selectivity towards silicon oxide layers over silicon regardless of whether the silicon is amorphous, crystalline or polycrystalline. The selectivity provides advantages for applications such as shallow trench isolation (STI) and inter-layer dielectric (ILD) recess formation. However, such a selectivity is problematic when trying to clean surface oxide, or other defects, from silicon materials in the presence of silicon oxide. This is particularly evident in the presence of chemically synthesized oxides, such as oxides generally utilized in STIs, and other isolations, which may be referred to as "low quality oxides" as discussed in greater detail below. Such a selectivity can remove a greater amount of oxide from the low quality oxide surface than desired in order to fully etch or clean the silicon material, reducing the effectiveness of the isolation or liner. Furthermore, as devices continue to reduce in size, over etching of oxide materials may contribute to further to problems such as unwanted epitaxial merging.

The present technology overcomes these issues by passivating the exposed low quality oxide prior to one or more cleaning or etching operations. By utilizing selective passivation materials and techniques, the passivation operation may be highly selective to the low quality oxide. This allows for protection of the low quality oxide while leaving the target etch material, such as a silicon material, exposed during one more etching or cleaning processes. Surprisingly, by carefully selecting the passivating material, little to no passivation may occur on the target material, requiring no additional removal or etching operations for cleaning or etching of the target material. Thus, the present technology may maintain all, or a high percentage of a low quality oxide, providing reduced occurrence of epitaxial merging and other defects due to over removal of one or more low quality oxides.

Although the remaining disclosure will routinely identify specific processes utilizing the disclosed technology, it will be readily understood that the systems and methods are equally applicable to other deposition and etching processes as may occur in the described chambers or any other chamber. Accordingly, the technology should not be considered to be so limited as for use with these specific deposition processes or chambers alone. The disclosure will discuss one set of possible chambers that may be used to perform processes according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
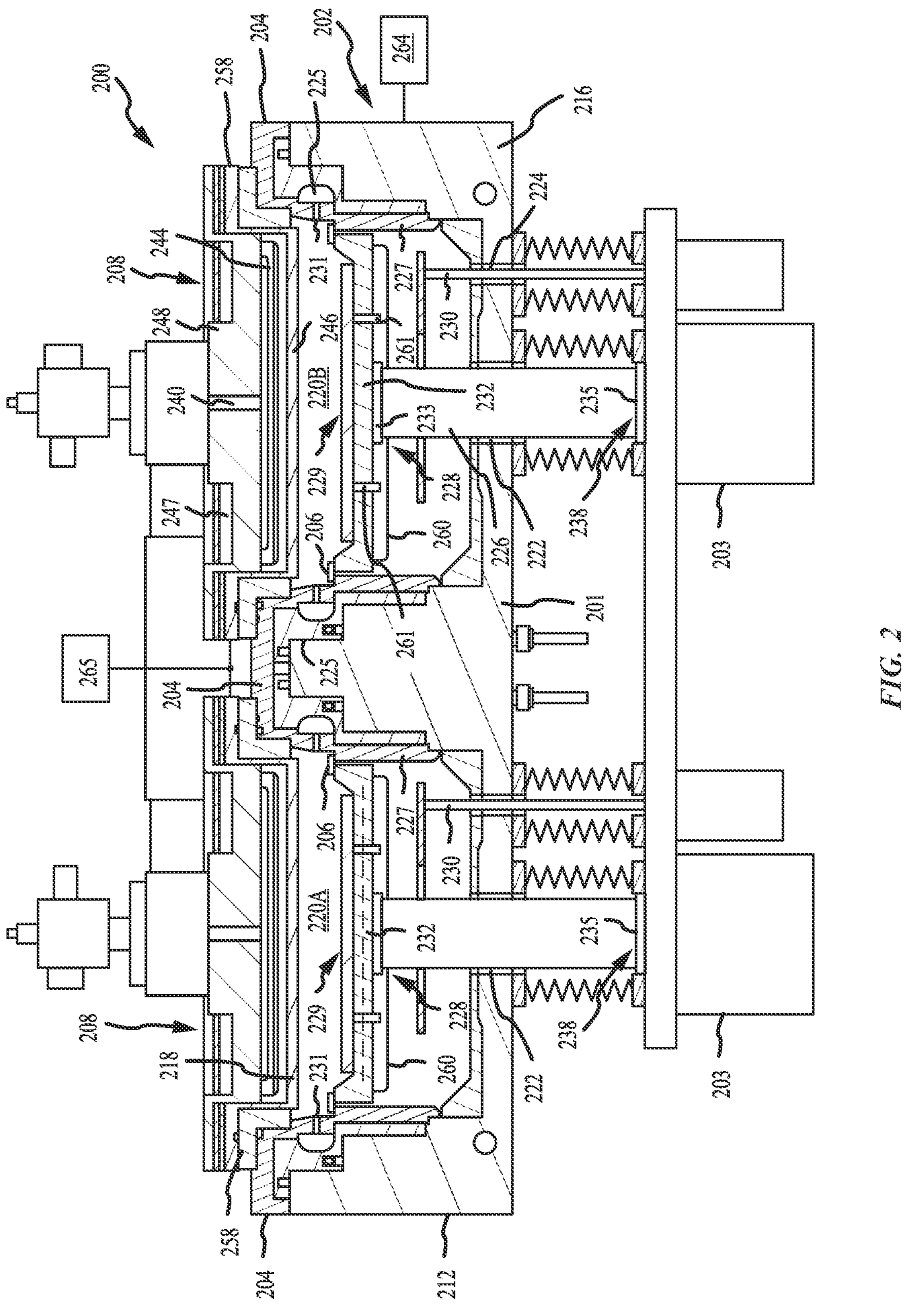
FIG. 2 shows a schematic cross-sectional view of an exemplary plasma deposition system according to embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
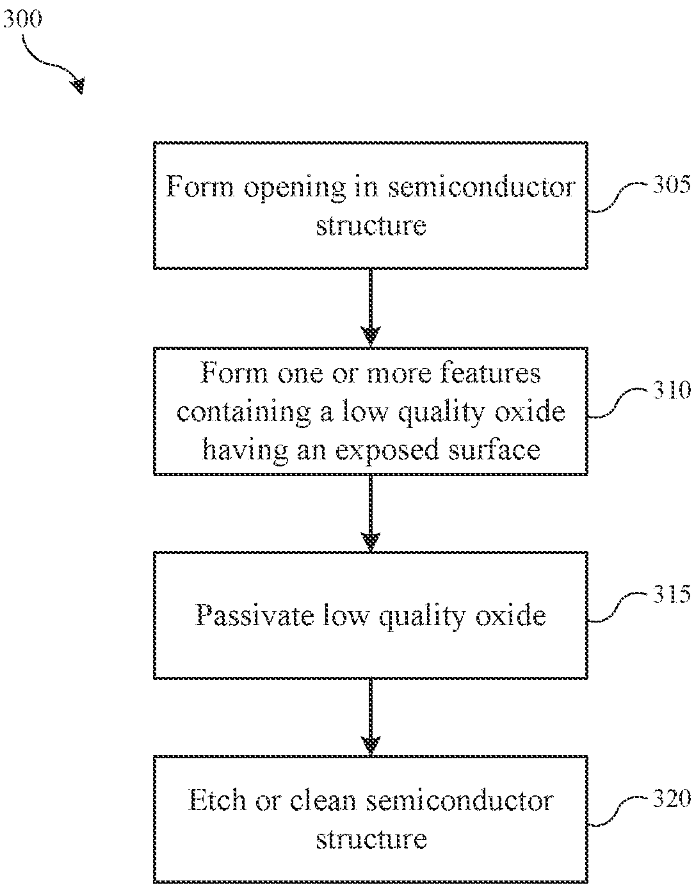
FIG. 3 shows operations in a semiconductor processing method according to embodiments of the present technology.

FIG. 3 shows exemplary operations in a semiconductor processing method 300 according to some embodiments of the present technology. The method may be performed in a variety of processing chambers, including system 200 described above. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 300 may involve optional operations to develop the semiconductor structure to a particular fabrication operation. Although in some embodiments method 300 may be performed on a base structure, in some embodiments the method may be performed subsequent other material formation or removal. For example, any number of deposition, masking, or removal operations may be performed to produce any transistor, memory, or other structural aspects on a substrate. The substrate may be disposed on a substrate support, which may be positioned within a processing region of a semiconductor processing chamber. The operations may be performed in the same chamber in which aspects of method 300 may be performed, and one or more operations may also be performed in one or more chambers on a similar platform as a chamber in which operations of method 300 may be performed, or on other platforms. Method 300 describes the operations shown schematically in FIGS. 4A-4D, the illustrations of which will be described in conjunction with the operations of method 300. It is to be understood that FIGS. 4A-4D illustrate only partial schematic views, and a substrate may contain any number of transistor sections having aspects as illustrated in the figures.

Figure 4A:
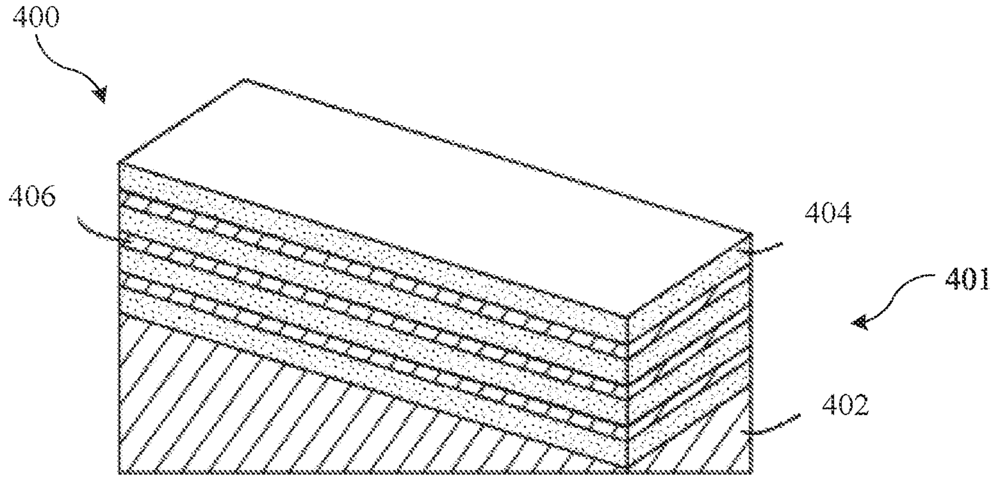
FIGS. 4A-4D show cross-sectional views of substrates being processed according to embodiments of the present technology.

As shown in FIG. 4A, a semiconductor device 400 including a substrate 402 may be provided. The substrate 402 may be any number of materials, such as a base wafer or substrate made of silicon or silicon-containing materials, germanium, other substrate materials, as well as one or more materials that may be formed overlying the substrate during semiconductor processing. In embodiments, the structure 400 may be a semiconductor substrate, including bulk substrates, epitaxially grown substrates, and/or silicon on insulator wafer. As used herein, the term "semiconductor substrate" refers to a substrate in which the entirety of the substrate is comprised of a semiconductor material. The semiconductor substrate may include any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In embodiments, the semiconductor material is silicon (Si). In one or more embodiments, the semiconductor substrate 300 includes a semiconductor material, e.g., silicon (Si), carbon (C), germanium (Ge), silicon germanium (SiGe), germanium tin (GeSn), other semiconductor materials, or any combination thereof. In one or more embodiments, the substrate 302 includes one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In embodiments, the semiconductor material may be a doped material, such as n-doped silicon (n-Si), or p-doped silicon (p-Si). In embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers.

Regardless of the substrate 402 provided, in embodiments where the semiconductor structure is a gate-all-around device, a superlattice structure 401 may be formed atop the top surface of the substrate 402. However, it should be clear that the processes and methods discussed herein may be compatible with other devices, such as any semiconductor structure which requires the etching of one or more target materials, such as a silicon material, in the presence of an exposed low quality oxide. In the illustrated embodiment, a superlattice structure 401 may include a plurality of semiconductor material layers 406 and a corresponding plurality of horizontal channel layers 404 alternatingly arranged in a plurality of stacked pairs. In some embodiments the plurality of stacked groups of layers include a silicon (Si) and silicon germanium (SiGe) group. However, the superlattice structure 401 may include any one or more of the substrate material discussed above. In embodiments, the some or all of a plurality of semiconductor material layers 406 may include silicon germanium (SiGe), and some or all of a plurality of horizontal channel layers 404 include silicon (Si). In other embodiments, the plurality of horizontal channel layers 404 include silicon germanium (SiGe), and the plurality of semiconductor materials layers 406 comprise silicon (Si).

In embodiments, the plurality of semiconductor material layers 406 and corresponding plurality of horizontal channel layers 404 can include any number of lattice matched material pairs suitable for forming a superlattice structure 404. In embodiments, the plurality of semiconductor material layers 406 and corresponding plurality of horizontal channel layers 404 include from about 2 to about 50 pairs of lattice matched materials. However, it should be clear that more or less pairs are contemplated.

Furthermore, in one or more embodiments, the thickness of the plurality of semiconductor material layers 406 and the plurality of horizontal channel layers 404 may be in the range of from about 2 nm to about 50 nm, such as from about 3 nm to about 20 nm, or such as from about 2 nm to about 15 nm.

Figure 4B:
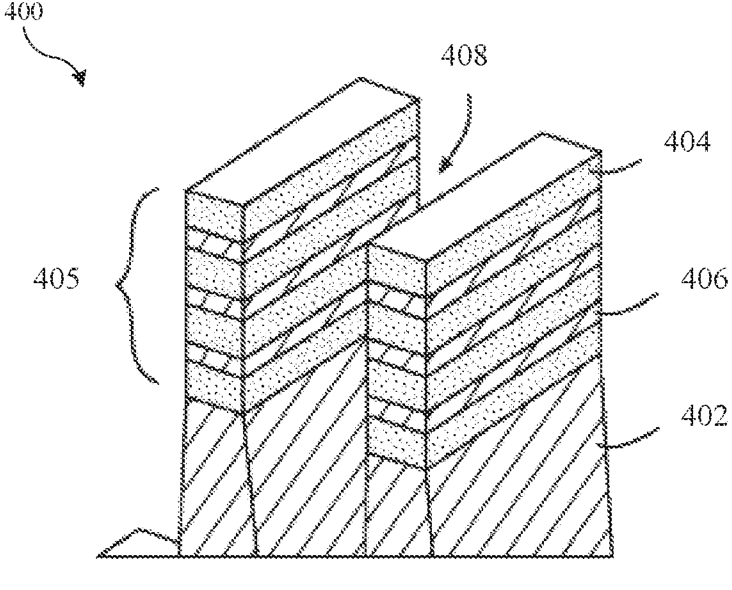

Referring next to FIG. 4B, at operation 305, the superlattice structure 401 may be patterned to form an opening 408 between adjacent stacks 405. The patterning may be done by any suitable etch process utilizing one or more patterns or otherwise, based upon the materials selected. For instance, in embodiments examples of openings include, but are not limited to, trenches which have a top, two sidewalls and a bottom. Openings may have any suitable aspect ratio (ratio of the depth of the feature to the width of the feature). In some embodiments, the aspect ratio is greater than or equal to about 5:1, about 10:1, about 15:1, about 20:1, about 25:1, about 30:1, about 35:1 or about 40:1, or any ranges or values therebetween.

Figure 4C:
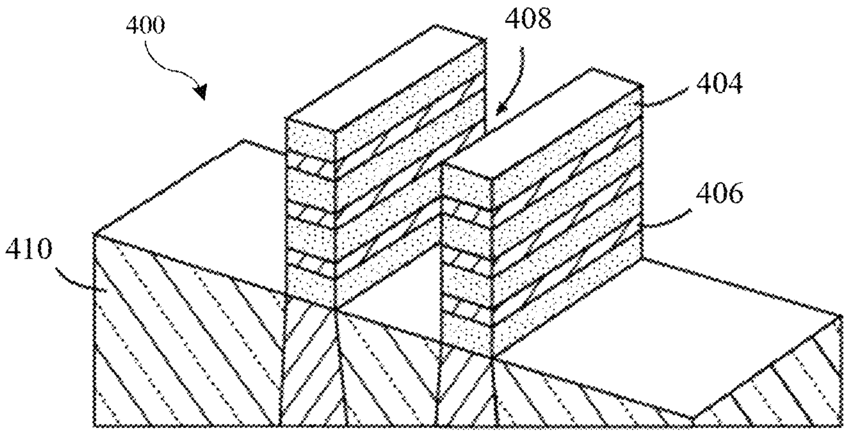

As illustrated in FIG. 4C, in embodiments, operation 310 may include forming one or more shallow trench isolations (STI) 410 may be formed in one or more of the formed openings. In embodiments, shallow trench isolation (STI) may refer to an integrated circuit feature which prevents current leakage. In one or more embodiments, a shallow trench isolation may be formed by depositing one or more dielectric materials (such as silicon dioxide) to fill the trench or opening 408 and removing the excess dielectric using a technique such as chemical-mechanical planarization.

In embodiments, the dielectric material forming shallow trench isolation 410 may be formed from a low quality oxide. In embodiments, a "low quality oxide" may refer to a film or layer that can have a lower wet etch rate than a second material, or may, for example, exhibit, an interface defect density ($D_{it}$) of greater than or about $10^{12}$ $cm^{-2}$ $eV^{-1}$, and/or a leakage current of greater than or about $4\times10^{-9}$ $A/cm^2$. Additionally or alternatively, a low quality oxide may refer to a layer or film having a surface hydroxyl concentration at the surface of the layer or film. For instance, in embodiments, a low quality oxide may have a surface hydroxyl concentration of greater than or about 1 $\mu mol/m^2$, such as greater than or about 2 $\mu mol/m^2$, such as greater than or about 3 $\mu mol/m^2$, such as greater than or about 4 $\mu mol/m^2$, such as greater than or about 5 $\mu mol/m^2$, such as greater than or about 6 $\mu mol/m^2$, such as greater than or about 7 $\mu mol/m^2$, such as greater than or about 8 $\mu mol/m^2$, such as greater than or about 9 $\mu mol/m^2$, or any ranges or values therebetween. In embodiments, an exemplary low quality oxide may be a chemical synthesized or deposited silicon oxide and/or a silicon dioxide, such as plasma enhanced chemical vapor deposition (PECVD) oxide and flowable chemical vapor deposition (FCVD) oxide, chemical oxides and spin-on-glass oxide.

Stated differently, in embodiments, the high quality semiconductor material may have little to no defects or surface hydroxyl concentration. For example, a "high quality semiconductor material" may refer to a film or layer that can have, for example, an interface defect density ($D_{it}$) of less than $10^{12}$ $cm^{-2}$ $eV^{-1}$, and/or a leakage current of less than $4\times10^{-9}$ $A/cm^2$. Additionally or alternatively, a high quality semiconductor material may refer to a layer or film having a low free hydroxyl concentration at the surface of the layer or film. For instance, in embodiments, a low quality oxide may have a surface hydroxyl concentration of less than or about 4 $\mu mol/m^2$, such as less than or about 3 $\mu mol/m^2$, such as less than or about 2 $\mu mol/m^2$, such as less than or about 1 $\mu mol/m^2$, such as less than or about 0.5 $\mu mol/m^2$, such as less than or about 0.25 $\mu mol/m^2$, such, or any ranges or values therebetween. Moreover, in embodiments, the high quality semiconductor material may have a surface that is generally free of hydroxyl groups at an exposed surface. In embodiments, the high quality semiconductor material may be a silicon-containing material. Exemplary high quality semiconductor materials may include silicon, silicon germanium, native oxide, thermal silicon oxide or dioxide, or combinations thereof.

Nonetheless, while materials and properties have been discussed, in embodiments, the low quality oxide may be an exposed surface within the structure that has a surface hydroxyl concentration that is greater than or about 20% higher than a high quality semiconductor material exposed surface hydroxyl concentration, such as greater than or about 30%, such as greater than or about 40%, such as greater than or about 50%, such as greater than or about 60%, such as greater than or about 70%, such as greater than or about 80%, such as greater than or about 90%, such as greater than or about 100% higher, or any ranges or values therebetween.

Figure 4D:
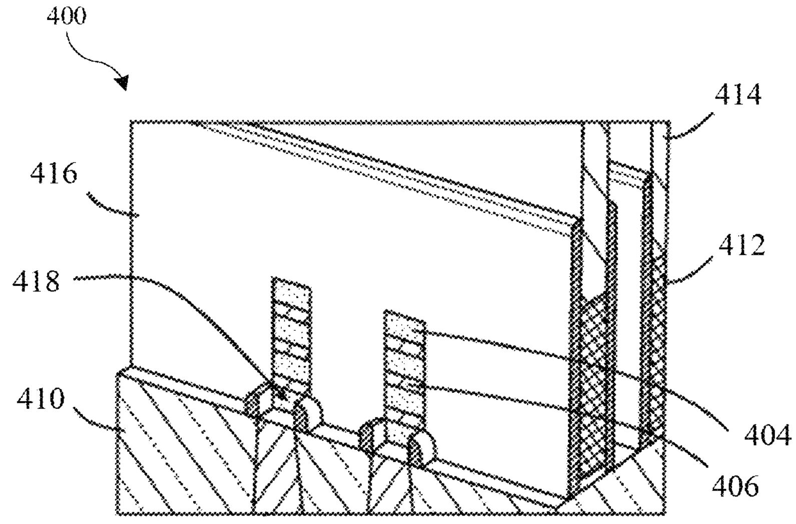

In embodiments, such as illustrated at FIG. 4D, a replacement gate structure (e.g., a dummy gate structure) may be formed utilizing patterning and deposition processes as known in the art. As illustrated, the gate structure may include one or more of a gate 414 and a poly-silicon layer 412. In one or more embodiments, the dummy gate structure may include one or more of tungsten (W), cobalt (Co), molybdenum (Mo), ruthenium (Ru), titanium nitride (TiN), tantalum nitride (TaN), titanium aluminum (TiAl), and N doped polysilicon. In embodiments, a source/drain region 418 may also be formed adjacent to one or more of the superlattice structures 401.

Moreover, in embodiments, one or more sidewall spacers 416 may be formed along outer sidewalls of the gate structure an on the structure 401. The sidewall spacers 416 may include any suitable insulating materials known in the art, for example, silicon nitride, silicon oxide, silicon oxynitride, silicon carbide, or the like. In some embodiments, the sidewall spacers are formed using any suitable conventional deposition and patterning process known in the art, such as atomic layer deposition, plasma enhanced atomic layer deposition, plasma enhanced chemical vapor deposition, low-pressure chemical vapor deposition, isotropic deposition, or a combination therefor.

Furthermore, while the illustrated embodiments, utilize a shallow trench isolation to illustrate a low quality oxide having an exposed surface during etching or cleaning of a target material, it should be clear that the methods and systems according to the present technology are also applicable to other semiconductor structure orientations. Moreover, it should be clear that the methods and systems discussed here are also applicable to cleaning and etching steps at different points in processing so long as a low quality oxide and a high quality semiconductor material each have an exposed surface in the structure and/or during the process.

Thus, in embodiments, a low quality oxide having surface properties discussed above may be subjected to a passivation treatment at operation 315. Namely, the present technology has found that by utilizing a low quality oxide having the discussed surface properties, such as high surface hydroxyl concentration, a passivating agent having a high selectivity to free hydroxyl concentration may be utilized. In such a manner, the low quality oxide may have a passivation layer formed thereon. Moreover, it was found that the formed passivation layer exhibited a higher resistance to etching and cleaning, protecting the low quality oxide from undesired etching.

For instance, in embodiments, the semiconductor structure having the low quality oxide with one or more exposed surface(s) and a high quality semiconductor material with one more exposed surface(s) is exposed to a carbon-containing precursor. The carbon-containing precursor may include silicon, oxygen, an amine, or a combination thereof. In embodiments, the carbon-containing precursor may include silicon, and one or more amine groups. The carbon-containing precursor may be any precursor include carbon and may include any type(s) of amine groups. In embodiments, the carbon-containing precursor may be or include hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS) ($CH_3$—O—Si—$(CH_3)_3$), dimethyldimethoxysilane (DMDMS) ($(CH_3)_2$—Si—$(OCH_3)_2$), methyltrimethoxysilane (MTMS) ($(CH_3$—O$)_3$—Si—$CH_3$), phenyltrimethoxysilane (PTMOS) ($C_6H_5$—Si—$(OCH_3)_3$), phenyldimethylchlorosilane (PDMCS) ($C_6H_5$—Si(Cl)—$(CH_3)_2$), dimethylaminotrimethylsilane (DMATMS) ($(CH_3)_2$ —N—Si—$(CH_3)_3$), or bis(dimethylamino)dimethylsilane (BDMADMS), as well as any other carbon-containing precursor that may be used in semiconductor processing. The precursors may or may not include delivery of additional precursors, such as one or more carrier gases to assist the flow of the carbon-containing precursor. The carrier gases may include helium, argon, or diatomic nitrogen.

In embodiments, the carbon-containing precursor may be an organosilane, which may be a vinyl silane containing compound. The vinyl silane may be in liquid or vapor form. In a vapor phase process the semiconductor structure is contacted with a vaporized vinyl silane containing compound. Vaporizing the vinyl silane containing compound may allow the vinyl silane containing compound to penetrate more deeply into the structure. Exemplary vinyl silane containing compounds may be of the formula:

(I)

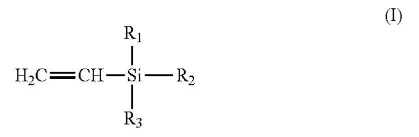

where $R_1$, $R_2$, and $R_3$ are each individually selected from hydrogen (H), alkyl groups (e.g., methyl, ethyl, propyl, butyl, etc), alkoxy groups (e.g., methoxy, ethoxy, propoxy etc.), chlorine, and vinyl groups. However, other substituted vinyl silanes may also fall within embodiments described herein. Other unsaturated compounds know to react with Si—OH including olefins, acetyl acetone, vinyl acetate, styrene may also be used with certain embodiments described herein.

Exemplary vinyl silanes include vinyl silane, trimethylvinylsilane (TMVS), vinyltrichlorosilane, vinyltrimethoxysilane, vinyltriethoxysilane, vinyltris(2-methoxyethoxy)silane, vinyltrisisopropoxysilane, vinyltris(tert-butylperoxy) silane, vinyldimethylchlorosilane, vinyldimethylethoxysilane, vinylmethyldichlorosilane, vinylmethyldimethoxysilane, vinylmethyldiethoxysilane, methylvinyldi(n-methylacetylamido)silane, methylvinyldi (5-caprolactam)silane, bis(methyldichlorosilyl)ethane, and combinations thereof. In embodiments, the vinyl silane containing compound is trimethylvinylsilane (TMVS).

In embodiments, method 300 may include generating a plasma of the carbon-containing precursor. The plasma effluents of the carbon-containing precursor may be generated at a plasma power of less than or about 3000 W, and may be generated at a plasma power of less than or about 2750 W, less than or about 2500 W, less than or about 2250 W, less than or about 2000 W, less than or about 1750 W, less than or about 1500 W, less than or about 1250 W, less than or about 1000 W, less than or about 750 W, less than or about 500 W, less than or about 250 W, or less. While a plasma of the carbon-containing precursor may be generated in some embodiments, other embodiments may include a thermal process that does not include generating a plasma of the carbon-containing precursor.

In embodiments, contacting the low quality oxide with the carbon-containing precursor or the plasma effluents thereof may introduce carbon to the silicon-containing material of low quality oxide, such as trench 410 in this example. The introduction of carbon and contacting at may replace carbon that was depleted during etching of the silicon-containing material, or that was not formed due to the process selected. The carbon-containing compound may be provided in vapor phase, which may allow the carbon-containing precursor to penetrate deeply into the remaining silicon-containing material of the low quality oxide, in embodiments. The vaporized carbon-containing precursor may be vaporized prior to being provided to the processing region or may be vaporized in the processing region.

Contacting the remaining silicon-containing material of the low quality oxide with the carbon-containing precursor or the plasma effluents thereof may increase the carbon concentration in the silicon-containing material of the low quality oxide. For example, after operation 315, the exposed surface of the silicon-containing material of the low quality oxide may be characterized by a carbon concentration of greater than or about 15 at. %, such as greater than or about 16 at. %, greater than or about 17 at. %, greater than or about 18 at. %, greater than or about 19 at. %, greater than or about 20 at. %, greater than or about 21 at. %, greater than or about 22 at. %, greater than or about 23 at. %, greater than or about 24 at. %, greater than or about 25 at. %, or more, or any ranges or values therebetween. In embodiments, contacting the remaining silicon-containing material of the low quality oxide with the carbon-containing precursor may increase the carbon concentration at the exposed surface of the remaining silicon-containing material of the low quality oxide by greater than or about 5 at. %, such as greater than or about 6 at. %, greater than or about 7 at. %, greater than or about 8 at. %, greater than or about 9 at. %, greater than or about 10 at. %, or more, or any ranges or values therebetween.

Optionally, method 300 may include exposing the substrate to ultraviolet (UV) radiation. The UV radiation source may be, for example, a UV lamp. The UV radiation source may be positioned outside of the semiconductor processing chamber, and the semiconductor processing chamber may have a quartz window through which UV radiation may pass. The structure 400 may be positioned in an inert gas environment, such as, for example, helium, argon, or diatomic nitrogen. The processing semiconductor chamber may include a microwave source to heat the silicon-containing material of the low quality oxide prior to or concurrently with contacting the silicon-containing material with UV radiation. In embodiments, the UV radiation exposure may be conducted using a plasma to simulate UV radiation wavelengths. The plasma may be formed by coupling RF power to a treatment gas such as, for example, helium, argon, molecular oxygen, or diatomic oxygen.

The passivation operation 315 may be conducted by placing the semiconductor structure 400 into a processing chamber, vaporizing the organosilane compound, and flowing the organosilane compound into the processing chamber. The organosilane compound may alternatively be vaporized in the processing chamber. The organosilane compound may be introduced into the processing chamber through a showerhead positioned at an upper portion of the processing chamber. A carrier gas, such as He, Ar, $N^2$, and combinations thereof may be used to assist the flow of the organosilane compound into the processing chamber. Additionally, a catalyst, such as water, may be added during the organosilane compound vapor phase process.

The organosilane compound vapor phase process may be conducted at a processing chamber pressure between 50 mTorr and 500 Torr, for example, from about 200 mTorr to about 6 Torr. During the silylation process, the dielectric film may be heated to a temperature from about 100° C. to about 400° C., for example, from about 200° C. to about 390° C. The flow rate of the vinyl silane containing compound may be between 1 sccm and 10,000 sccm, for example, from about 400 sccm to about 2,000 sccm. The flow rate of the optional carrier gas may be between 1 sccm and 10,000 sccm, for example, from about 2,000 sccm to about 3,000 sccm. The processing time may be between 1 min and 10 min, such as 3 min. The pressure within the processing chamber may be varied during the vapor phase process. For example, the pressure may be varied between 50 Torr and 500 Torr.

In embodiments, passivation operation 315 may optionally include exposing the semiconductor structure 400 to an ultraviolet (UV) cure process to remove any remaining Si—H from the dielectric film and/or water from the damaged pores and aid in formation of the Si—O—$Si(CH_3)_3$ groups on the surface of the low quality oxide. The UV cure process may be conducted by placing the semiconductor structure 400 into a processing chamber and engaging a source of UV radiation to contact the semiconductor structure with UV radiation. The UV radiation source may be a UV lamp, for example. The UV radiation source may be positioned outside of the processing chamber, and the processing chamber may have a quartz window through which UV radiation may pass. During the optional UV process, the semiconductor structure 400 may be positioned in an inert gas environment, such as He or Ar, for example. The processing chamber may also include a microwave source to heat semiconductor structure 400 prior to or concurrently with contacting with UV radiation. The UV cure process may also be conducted using a plasma to simulate UV radiation wavelengths. The plasma may be formed by coupling RF power to a treatment gas such as He, Ar, $O_2$, and $N_2$. The plasma may be formed by a remote plasma source (RPS) and delivered to the processing chamber.

When utilized, the optional UV cure process may be conducted at a processing chamber pressure between 1 Torr and 100 Torr, such as 6 Torr, a dielectric film temperature between 20° C. and 400° C., such as 385° C., an environment gas flow rate between 8,000 sccm and 24,000 sccm, such as 16,000 sccm, a treatment gas flow rate between 2,000 sccm and 20,000 sccm, such as 12,000 sccm, a RF power between 50 W and 1,000 W, such as 500 W, a RF power frequency of 13.56 MHz, a processing time between 10 sec and 180 sec, such as 60 sec, a UV irradiance power between 100 $W/m^2$ and 2,000 $W/m^2$, such as 1,500 $W/m^2$, and UV wavelengths between 100 nm and 400 nm.

Regardless, after passivation operation 315, the semiconductor substrate having one or more low quality oxides with a one or more passivated exposed surfaces and a high quality semiconductor material with one or more exposed surfaces may be exposed to one or more etching or cleaning processes at operation 320. The cleaning or etch process of operation 320 may include any suitable etch process that is selective to the target high quality semiconductor material, as the low quality oxide is protected by the passivation layer. In some embodiments the etch process of operation 320 comprises one or more of a wet etch process or a dry etch process.

In embodiments, the dry etch process may include a conventional plasma etch, or a remote plasma-assisted dry etch process, such as a SiCoNi™ etch process or a Selectra™, available from Applied Materials, Inc., located in Santa Clara, Calif. In a SiCoNi™ or Selectra™ etch process, the device is exposed to $H_2$, $NF_3$, and/or $NH_3$ plasma species, e.g., plasma-excited hydrogen and fluorine species and/or anhydrous HF and $NH_3$. For example, in some embodiments, the device may undergo simultaneous exposure to $H_2$, $NF_3$, and $NH_3$ plasma. The SiCoNi™ or Selectra™ etch process may be performed in a preclean chamber, which may be integrated into one of a variety of multi-processing platforms, including the Centura®, Dual ACP, Producer® GT, and Endura® platform, available from Applied Materials®. The wet etch process may include a hydrofluoric (HF) acid last process, i.e., the so-called "HF last" process, in which HF etching of surface is performed that leaves surface hydrogen-terminated. Alternatively, any other liquid-based pre-epitaxial pre-clean process may be employed. In some embodiments, the process comprises a sublimation etch for native oxide removal. The etch process can be plasma or thermally based. The plasma processes can be any suitable plasma (e.g., conductively coupled plasma, inductively coupled plasma, microwave plasma).

In embodiments, the etchant may include providing one or more etchant precursors, and the precursors may include, for example, a hydrogen-containing precursor, a nitrogen-containing precursor, an oxygen-containing precursor, or any other conventional semiconductor precursors used to remove silicon-containing material. In one example, the one or more etchant precursors may include diatomic hydrogen and diatomic nitrogen. In another example, one or more etchant precursors may include diatomic hydrogen and molecular oxygen. In embodiments, etching or cleaning operation 320 may include forming a plasma of the one or more etchant precursors to increase bombardment and removal of the high quality semiconductor material.

In embodiments, method 300 may include generating a plasma of the etchant precursor. The plasma effluents of the etchant precursor may be generated at a plasma power of less than or about 3000 W, and may be generated at a plasma power of less than or about 2750 W, less than or about 2500 W, less than or about 2250 W, less than or about 2000 W, less than or about 1750 W, less than or about 1500 W, less than or about 1250 W, less than or about 1000 W, less than or about 750 W, less than or about 500 W, less than or about 250 W, or less. While a plasma of the etchant precursor may be generated in some embodiments, other embodiments may include a thermal process that does not include generating a plasma of the etchant precursor.

Additionally or alternatively, operation 320 may include providing a cleaning agent to the processing region of the semiconductor processing chamber and contacting the semiconductor structure with the cleaning agent. The cleaning agent may be any wet etchant and may be, for example, a fluorine-containing cleaning agent. In embodiments, the fluorine-containing cleaning agent may be or include dilute hydrofluoric acid.

Process conditions may impact the operations performed in method 300. Each of the operations of method 300 may be performed during a constant temperature in embodiments, while in some embodiments the temperature may be adjusted during different operations. In some embodiments of the present technology, method 300 may be performed at substrate, pedestal, and/or chamber temperatures less or about 500° C., which may be due to thermal budget issues, and may be performed at temperatures less than or about 475° C., less than or about 450° C., less than or about 425° C., less than or about 400° C., less than or about 375° C., less or about 350° C., less or about 325° C., less or about 300° C., less or about 275° C., less or about 250° C., or lower. The temperature may also be maintained at any temperature within these ranges, within smaller ranges encompassed by these ranges, or between any of these ranges. Forming material at increased temperatures may increase the amount of carbon introduced into the silicon-containing material of the spacer 435 at operation 320 and, therefore, improve resistant to wet etchants. Accordingly, in some embodiments, the temperature may be maintained between at greater than or about 200° C., and may be maintained at greater than or about 225° C., greater than or about 250° C., greater than or about 275° C., greater than or about 300° C., greater than or about 325° C., greater than or about 350° C., or higher.

The pressure within the semiconductor processing chamber may also affect the operations performed. In embodiments, the pressure may be maintained at less than about 100 Torr. Accordingly, the pressure may be maintained at less than or about 50 Torr, less than or about 40 Torr, less than or about 30 Torr, less than or about 25 Torr, less than or about 20 Torr, less than or about 18 Torr, less than or about 16 Torr, less than or about 14 Torr, less than or about 12 Torr, less than or about 10 Torr, less than or about 8 Torr, less than or about 6 Torr, less than or about 4 Torr, less than or about 2 Torr, or less, or any ranges or values therebetween. The pressure may also be maintained at any pressure within these ranges, within smaller ranges encompassed by these ranges, or between any of these ranges.

Regardless of the etching or cleaning conducted, surprisingly, the present technology has found that by utilizing a passivation layer discussed herein, excellent etching of the target high quality semiconductor material may be achieved while reducing or even eliminating undesired low quality oxide removal. Namely, in embodiments, due to the passivation material selected, little to no reduction in the etching of the target material may be exhibited. Surprisingly, unlike conventional etch processes where the etchant or cleaning agent has a low selectivity to the low quality oxide, the etchant or cleaning agent discussed herein may etch the high quality semiconductor material at a rate equal to or greater than the low quality oxide. For instance, in embodiments, the etching or cleaning process herein may etch the high quality semiconductor material at an equal or higher rate than the low quality oxide, such as a rate that is greater than or about 0% higher, such as greater than or about 1% higher, such as greater than or about 2%, such as greater than or about 3%, such as greater than or about 4%, such as greater than or about 5%, such as greater than or about 6%, such as greater than or about 7%, such as greater than or about 8%, such as greater than or about 9%, such as greater than or about 10%, or any ranges or values therebetween.

During standard etching and/or cleaning processes where a semiconductor structure contains an exposed low quality oxide, the shallow trench isolation may exhibit an increase in depth of greater than or about 20%, such as greater than or about 25%, or even greater, correlating to loss of low quality oxide at a bottom surface and side surface of the shallow trench isolation.

Conversely, by utilizing the methods and systems discussed herein, a passivating layer may be able to protect the exposed surface, as well as diffuse into the exposed surface of the low quality oxide, protecting the surface as well as some of the underlying low quality oxide. In such a manner, even if an exposed surface is removed during etching, the underlying passivation may continue to protect the low quality oxide. Thus, in embodiments, after an etch and/or cleaning operation discussed herein the semiconductor structure may exhibit a low quality oxide loss of less than 20%, such as less than or about 17.5%, such as less than or about 15%, such as less than or about 12.5%, such as less than or about 10%, such as less than or about 7.5%, such as less than or about 5%, such as less than or about 2.5%, such as less than or about 1%, or any ranges or values therebetween. As discussed above, by reducing the low quality oxide loss, improved semiconductor structures may be formed, as the risk and occurrence of epitaxial merge, as an example only, may be greatly decreased.

Surprisingly, the passivation layer discussed herein does not interfere with further semiconductor processing. Thus, in embodiments, the passivation layer may remain in place after the etching or cleaning process, and may not require removal before a further deposition or etch operation.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursor, and reference to "the material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:

etching a portion of a silicon-containing material from a substrate disposed within a processing region of a semiconductor processing chamber, forming one or more recesses;

forming a low quality oxide within one or more of the recesses, wherein the low quality oxide and a silicon-containing material each comprise an exposed surface, and wherein the low quality oxide is a film or layer comprising an interface defect density ($D_{it}$) of greater than or about $10^{12}$ $cm^{-2}$ $eV^{-1}$, a leakage current of greater than or about $4\times10^{-9}$ $A/cm^2$, and/or a surface hydroxyl content of greater than or about 1 $\mu mol/m^2$;

contacting the low quality oxide and the silicon-containing material with a passivating agent, forming a passivation layer on the low quality oxide; and contacting the low quality oxide and the silicon-containing material with an etching agent and/or a cleaning agent, wherein the contacting with the cleaning agent removes the silicon-containing material at an equal or faster rate than the low quality oxide.

2. The semiconductor processing method of claim 1, wherein the passivating agent comprises an organosilane.

3. The semiconductor processing method of claim 2, wherein the organosilane comprises a vinyl silane.

4. The semiconductor processing method of claim 3, wherein the vinyl silane comprises vinyl silane, trimethylvinylsilane (TMVS), vinyltrichlorosilane, vinyltrimethoxysilane, vinyltriethoxysilane, vinyltris(2-methoxyethoxy) silane, vinyltrisisopropoxysilane, vinyltris(tert-butylperoxy) silane, vinyldimethylchlorosilane, vinyldimethylethoxysilane, vinylmethyldichlorosilane, vinylmethyldimethoxysilane, vinylmethyldiethoxysilane, methylvinyldi (n-methylacetylamido) silane, methylvinyldi (5-caprolactam)silane, bis(methyldichlorosilyl) ethane, and combinations thereof.

5. The semiconductor processing method of claim 1, wherein contacting the low quality oxide with the passivating agent comprises a silylation process.

6. The semiconductor processing method of claim 1, wherein the low quality oxide comprises a surface hydroxyl content of greater than or about 4 $\mu mol/m^2$.

7. The semiconductor processing method of claim 6, wherein the low quality oxide comprise a chemical oxide of silicon.

8. The semiconductor processing method of claim 1, wherein the silicon-containing material comprises a surface hydroxyl content of less than or about 2 μmol/$m^2$.

9. The semiconductor processing method of claim 8, wherein the silicon-containing material comprises polysilicon, silicon germanium, thermal silicon oxide or dioxide, native oxide, or a combination thereof.

10. The semiconductor processing method claim 1, wherein less than or about 20% of the low quality oxide is removed after contacting with the etching agent and/or cleaning agent.

11. A method of forming a semiconductor structure comprising:

etching one or more recesses in a substrate disposed within a processing region of a semiconductor processing chamber, wherein a silicon-containing material extends into one or more recesses defined by alternating layers of material deposited on the substrate, and wherein an exposed surface of the silicon-containing material is characterized by a first hydroxyl concentration;

forming an oxide material in the one or more recesses, the oxide material having an exposed surface characterized by a second hydroxyl concentration, wherein the second hydroxyl concentration is greater than the first hydroxyl concentration;

exposing the processing region to a passivating agent, wherein the passivating agent undergoes a silylation process with one or more hydroxyl groups; and contacting the substrate with an etching agent and/or a cleaning agent.

12. The method of claim 11, further comprising:

providing one or more etchant precursors to the processing region of the semiconductor processing chamber;

contacting the substrate with the one or more etchant precursors; and etching a portion of the silicon-containing material from the substrate.

13. The method of claim 11, wherein the second hydroxyl concentration is greater than or about 50% higher than the first hydroxyl concentration.

14. The method of claim 13, wherein the second hydroxyl concentration is greater than or about 100% higher than the first hydroxyl concentration.

15. The method of claim 11, wherein the semiconductor structure comprises a gate all around structure.

16. The method of claim 11, further comprising:

exposing the substrate to ultraviolet (UV) radiation.

17. A semiconductor processing method comprising:

contacting a semiconductor structure with a passivating agent, the semiconductor structure comprising a substrate, a silicon-containing material having an exposed surface characterized by a first hydroxyl concentration, and an oxide material having an exposed surface characterized by a second hydroxyl concentration, wherein the second hydroxyl concentration is greater than the first hydroxyl concentration, wherein the passivating agent undergoes a silylation process with one or more hydroxyl groups; and contacting the substrate with an etching agent and/or a cleaning agent, removing a portion of the silicon-containing material.

18. The semiconductor processing method of claim 17, wherein less than or about 20% of the oxide material is removed after contacting with the etching agent and/or cleaning agent.

19. The semiconductor processing method of claim 17, wherein passivating occurs in a first chamber, and wherein the semiconductor structure is transferred to a second processing chamber prior to contacting the semiconductor structure with the etching agent and/or cleaning agent.

20. The semiconductor processing method of claim 17, wherein contacting the substrate with the etching agent and/or cleaning agent comprises a reactive ion etch, a selective oxide preclean, or a combination thereof.

* * * * *